US009171747B2

(12) United States Patent
Bachman et al.

(10) Patent No.: US 9,171,747 B2
(45) Date of Patent: Oct. 27, 2015

(54) METHOD AND APPARATUS FOR IRRADIATING A SEMI-CONDUCTOR WAFER WITH ULTRAVIOLET LIGHT

(71) Applicant: Nordson Corporation, Westlake, OH (US)

(72) Inventors: James V. Bachman, Lorain, OH (US); James M. Borsuk, Westlake, OH (US); James Khoury, Strongsville, OH (US); Edward C. McGhee, Amherst, OH (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 14/217,715

(22) Filed: Mar. 18, 2014

(65) Prior Publication Data

US 2014/0306603 A1   Oct. 16, 2014

Related U.S. Application Data

(60) Provisional application No. 61/810,357, filed on Apr. 10, 2013.

(51) Int. Cl.
*H01J 37/32* (2006.01)
*H01L 21/67* (2006.01)
*H01J 65/04* (2006.01)

(52) U.S. Cl.
CPC ......... *H01L 21/67115* (2013.01); *H01J 65/044* (2013.01)

(58) Field of Classification Search
CPC ..... H01J 65/044; H01J 65/048; H01J 65/042; H01J 25/50; H01J 25/587; H01L 21/67115

USPC ................ 315/113, 248, 152; 430/325, 281.1
See application file for complete search history.

(56) References Cited

U.S. PATENT DOCUMENTS

| | | | |
|---|---|---|---|
| 4,665,627 A | 5/1987 | Wilde et al. | |
| 4,718,974 A * | 1/1988 | Minaee | 438/708 |
| 5,723,943 A | 3/1998 | Brooker et al. | |
| 6,323,601 B1 | 11/2001 | Klein et al. | |
| 6,850,010 B1 * | 2/2005 | Barry et al. | 315/39.51 |
| 7,544,948 B2 | 6/2009 | Schonlein et al. | |
| 7,709,814 B2 | 5/2010 | Waldfried et al. | |
| 2003/0020414 A1 | 1/2003 | Schmitkons et al. | |
| 2003/0142198 A1 | 7/2003 | Miyake | |
| 2004/0183481 A1 | 9/2004 | Borsuk et al. | |
| 2005/0173375 A1 | 8/2005 | Mitrovic et al. | |
| 2006/0049360 A1 * | 3/2006 | Schoenlein et al. | 250/372 |

(Continued)

FOREIGN PATENT DOCUMENTS

| CN | 1343852 A | 4/2002 |
|---|---|---|
| CN | 1422436 A | 6/2003 |

(Continued)

*Primary Examiner* — Tung X Le
*Assistant Examiner* — Raymond R Chai
(74) *Attorney, Agent, or Firm* — Wood, Herron & Evans, LLP

(57) ABSTRACT

An apparatus for generating ultraviolet light and irradiating a 450 mm diameter semi-conductor wafer. The apparatus includes a plenum and an array of nine RF irradiator units coupled with the plenum. Each irradiator unit includes a plasma lamp bulb and an RF generator operable to generate a radiation energy field to excite the plasma lamp bulb and emit the ultraviolet light. The nine irradiator units are arranged in three rows with three of the irradiator units in each row.

7 Claims, 5 Drawing Sheets

(56) References Cited

U.S. PATENT DOCUMENTS

2009/0289552 A1* 11/2009 Borsuk et al. ............... 315/56
2011/0204791 A1* 8/2011 Doughty et al. ............. 315/113
2013/0093322 A1 4/2013 Borsuk et al.

FOREIGN PATENT DOCUMENTS

| | | |
|---|---|---|
| CN | 1685466 A | 10/2005 |
| CN | 1734252 A | 2/2006 |
| WO | 2012009353 A1 | 1/2012 |

* cited by examiner

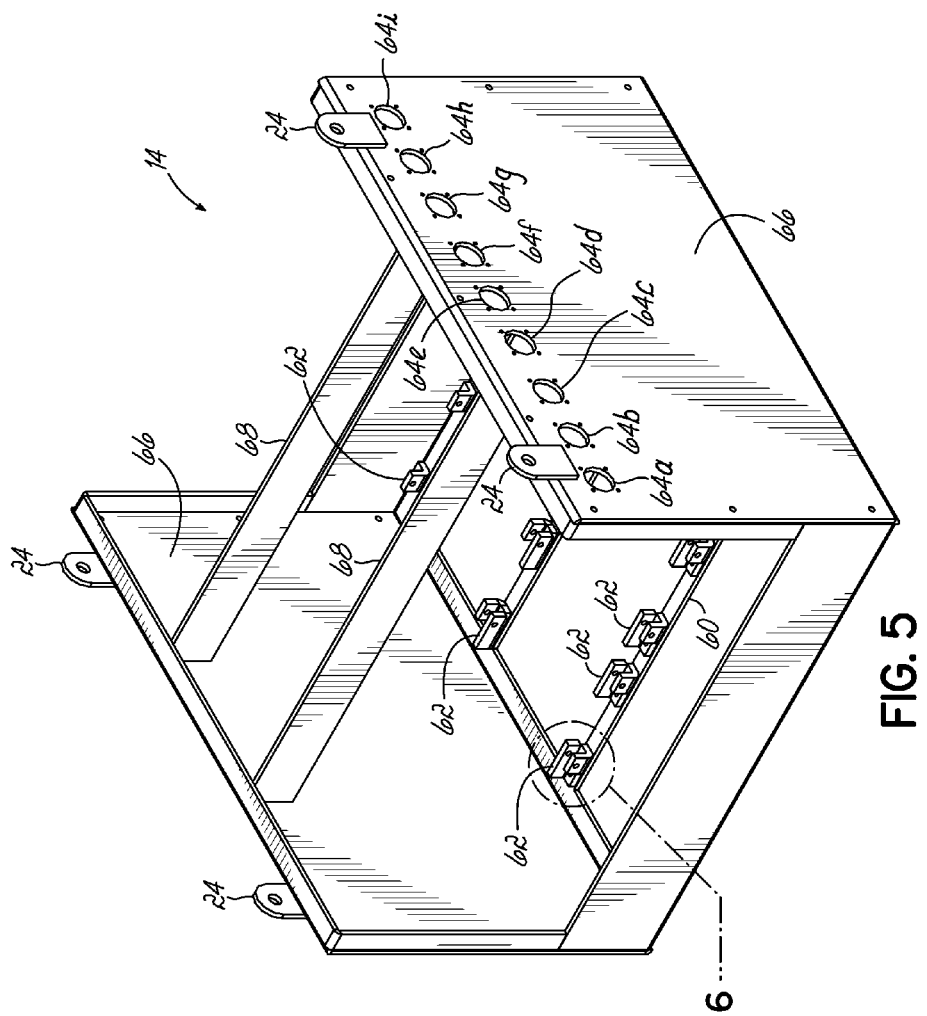
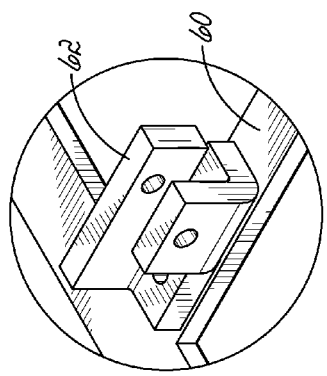
FIG. 5
FIG. 6

METHOD AND APPARATUS FOR IRRADIATING A SEMI-CONDUCTOR WAFER WITH ULTRAVIOLET LIGHT

CROSS-REFERENCE TO RELATED APPLICATION

This application claims the priority of application Ser. No. 61/810,357 filed Apr. 10, 2013 (pending), the disclosure of which is hereby incorporated by reference herein.

TECHNICAL FIELD

The present invention relates generally to an ultraviolet lamp system and method for irradiating large diameter semi-conductor wafers.

BACKGROUND

Ultraviolet (UV) lamp systems are commonly used for treating semi-conductor wafers for use in the electronics industry. Certain UV lamp systems have electrodeless light sources and operate by exciting an electrodeless plasma lamp with RF energy, such as microwave energy. In an electrodeless UV lamp system that relies upon excitation with microwave energy, the electrodeless plasma lamp is mounted within a metallic microwave cavity or chamber. One or more RF (radio frequency) or microwave generators, such as magnetrons, are coupled via waveguides with the interior of the microwave chamber. The magnetrons supply microwave energy to initiate and sustain a plasma from a gas mixture enclosed in the plasma lamp. The plasma emits a characteristic spectrum of electromagnetic radiation strongly weighted with spectral lines or photons having UV and infrared wavelengths.

To irradiate a substrate, the UV light is directed from the RF or microwave chamber through a chamber outlet to an external location. The chamber outlet is capable of blocking emission of RF or microwave energy while allowing UV light to be transmitted outside the chamber. A fine-meshed metal screen often covers the chamber outlet of many RF or microwave powered UV lamp systems. The openings in the metal screen transmit the UV light for irradiating a substrate positioned outside the chamber, yet substantially block the emission of RF or microwave energy. In some RF or microwave powered UV lamp systems, a shutter also covers the chamber outlet and is selectively operable to expose the substrate to the UV light.

In existing applications for treating semi-conductor wafers on the order of 300 mm in diameter, UV lamp systems are provided to emit light with the required uniformity, intensity and dosage over the surface area of the wafer. For example, one existing UV lamp system for treating a 300 mm semi-conductor wafer having surface area of 70,685 mm$^2$ uses two 10" lamp bulbs each powered by two magnetrons to properly surface treat the wafer. These lamp bulbs are configured in parallel to each other. Electrical power in a total amount of 12 kilowatts is provided to the lamp system, or in other words, 600 watts per inch of bulb length. The power density of the system is equal to the total wattage inputted divided by the wafer surface area. In the case of the 300 mm diameter wafer, the power density is therefore 0.1698 w/mm$^2$. One challenge associated with this existing system and others that use multiple magnetrons in a single cavity is the "cross talk" or interference that can exist between the multiple magnetrons, especially at start up. This can damage the magnetrons and lead to shorter life. In addition, the latest semi-conductor wafers are 450 mm in diameter and, therefore, have a surface area of 159,043 mm$^2$, which is much larger in surface area than the 300 mm diameter wafers. Specifically, the surface area is 2.25 times the area of the 300 mm diameter wafer. Therefore, in order to obtain the same power density as needed for the 300 mm diameter wafer the power input requirement for a lamp system used to treat the 450 mm diameter wafer is 27 kilowatts (i.e., 2.25 times 12 kilowatts). However, developing a UV lamp system for treating the 450 mm diameter semi-conductor wafer presents a significant challenge that extends well beyond these basic calculations due to the need for optimum intensity, dosage and uniformity of UV coverage over the entire 450 mm diameter semi-conductor wafer.

There is a need, therefore, for apparatus that achieves the advantages of providing necessary UV radiation intensity and dosage over the entire surface area of a 450 mm diameter semi-conductor wafer while also providing uniform UV radiation across the entire 450 mm diameter semi-conductor wafer and maintaining high productivity.

SUMMARY

The present invention generally provides an apparatus for generating ultraviolet light and irradiating a 450 mm diameter semi-conductor wafer. The apparatus comprises a housing or plenum, and an array of nine RF irradiator units coupled with the plenum. Each irradiator unit includes a plasma lamp bulb and an RF generator operable to generate a radiation energy field to excite the plasma lamp bulb and emit the ultraviolet light. The nine irradiator units are arranged in three rows with three of the irradiator units in each row. In an additional aspect, each of the nine irradiator units further comprises a single cavity unit having a single magnetron, a single irradiator and chamber including a single lamp bulb to inhibit cross talk or interference between magnetrons. In an additional aspect, a closed loop control is coupled with the array of nine irradiator units. The closed loop control provides real time power adjustments for providing uniform distribution of radiation energy based on a selected power setting.

The invention further provides a method of uniformly irradiating a 450 mm diameter semi-conductor wafer with ultraviolet light.

Various additional features and advantages of the invention will become more apparent to those of ordinary skill in the art upon review of the following detailed description of the illustrative embodiments taken in conjunction with the accompanying drawings.

BRIEF DESCRIPTION OF THE DRAWINGS

FIG. 5 is a perspective view of the plenum shown in FIG. 1, but with the top, front and back panel sections removed to show interior details.

FIG. 6 is an enlarged view of a lug or bracket used to hold the irradiator units to a base of the plenum.

DETAILED DESCRIPTION

Figure 1:
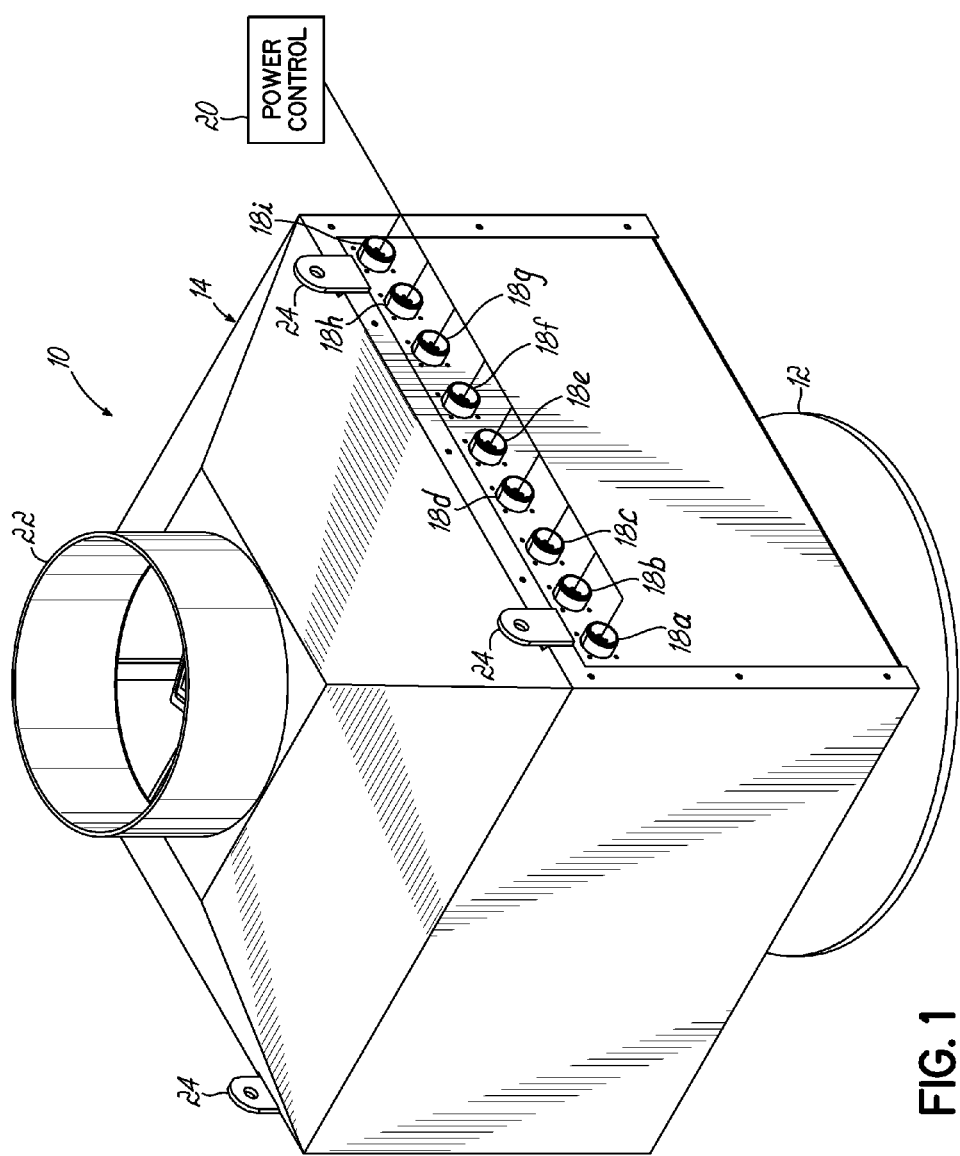
FIG. 1 is a perspective view of an apparatus for generating ultraviolet light, shown in position to irradiate a 450 mm diameter semi-conductor wafer.
Figure 2:
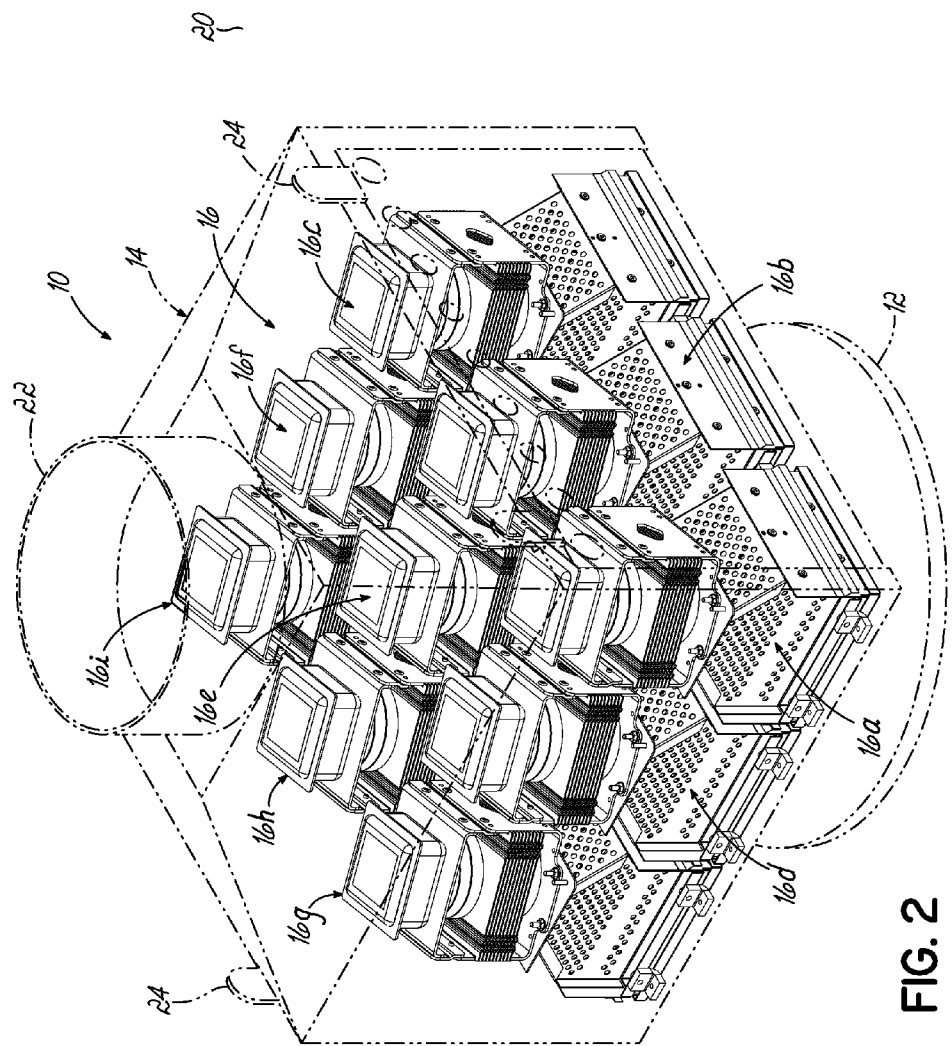
FIG. 2 is a perspective view similar to FIG. 1, but illustrating the plenum and the semi-conductor wafer in dash-dot lines to illustrate an array of nine microwave irradiator units within the plenum.

Turning first to FIGS. 1 and 2, an apparatus 10 for generating ultraviolet light and irradiating a 450 mm diameter semi-conductor wafer 12, is shown. The apparatus 10 includes a plenum 14, and an array 16 of nine microwave irradiator units 16a-i coupled with the plenum 14. In this embodiment, the array 16 is enclosed or contained completely within the plenum 14. It will be understood that various types of arrangements and configurations may be utilized for operatively connecting the array to a suitable plenum. As be described below, each of the microwave irradiator units 16a-i is separately coupled to the plenum 14, however, a more integrated coupling or manufacturing of the microwave irradiator units 16a-i and plenum 14 may be utilized instead. In this embodiment, as shown in FIG. 1, nine electrical connector fittings 18a-i extend from the plenum 14. This provides a one-to-one correspondence between the electrical connector fittings 18a-i and the microwave irradiator units 16a-i. The electrical connector fittings 18a-i are suitably coupled to a power control 20 such that high voltage electrical power and low voltage electrical control are provided to each irradiator unit 16a-i in the desired manner. In other embodiments, a lower number of electrical connectors may be used instead, and even a single connector may be used to electrically connect to all of the microwave irradiator units 16a-i for purposes of supplying electrical power and control. A duct 22 or opening is shown at the top of the plenum 14 for introducing cooling air into the plenum 14 for purposes of cooling the array 16 during operation. The cooling air will exhaust from the lower ends of each irradiator unit and from the plenum. Lifting brackets or tabs 24 are mounted to the exterior of the plenum 14 in order to allow easy lifting of the apparatus 10. Although not shown, a plurality of reflectors would be arranged to direct the ultraviolet light at the wafer 12 as it is emitted from the irradiator units 16a-i.

Figure 3:
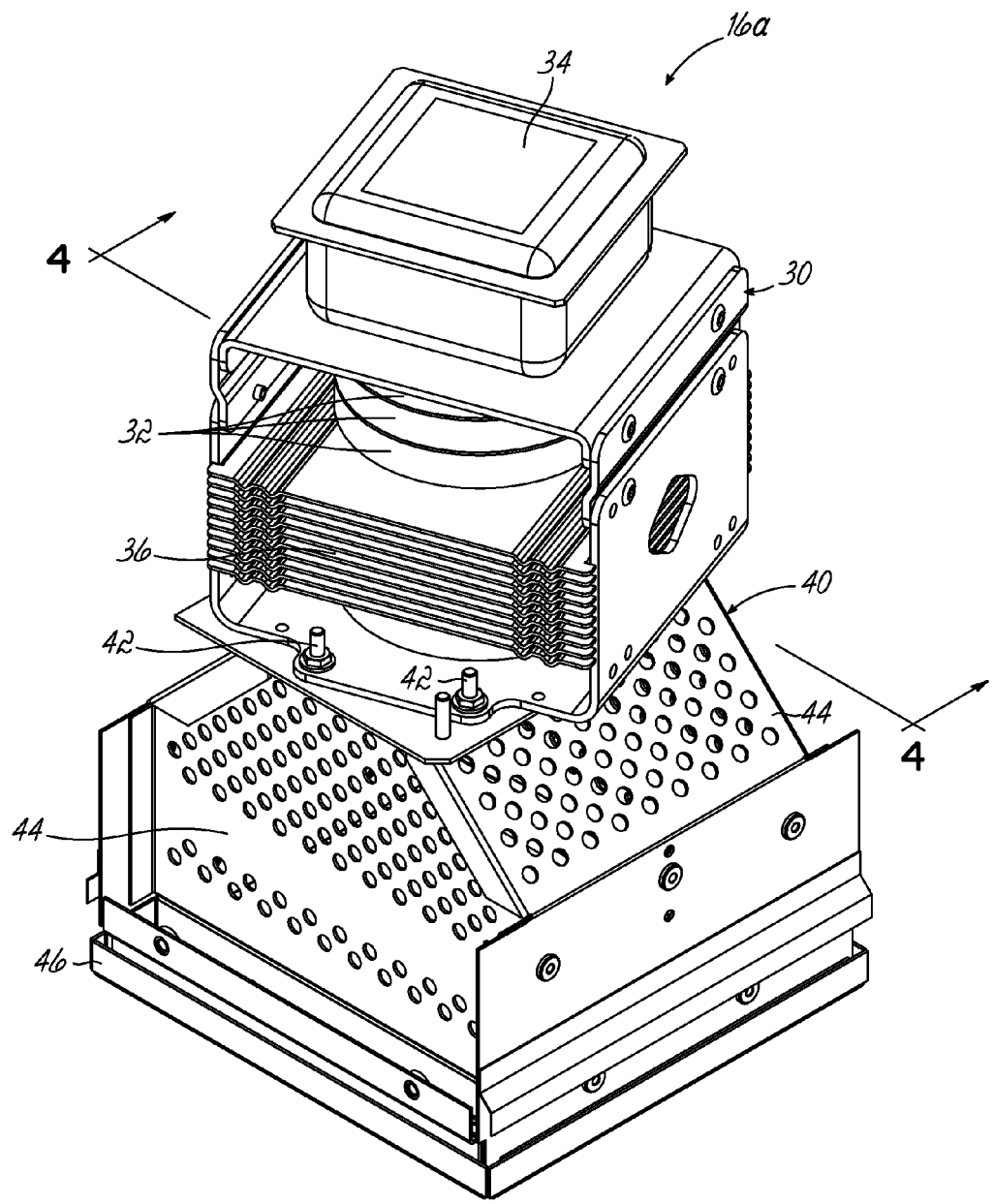
FIG. 3 is a perspective view of a single one of the microwave irradiator units.
Figure 4:
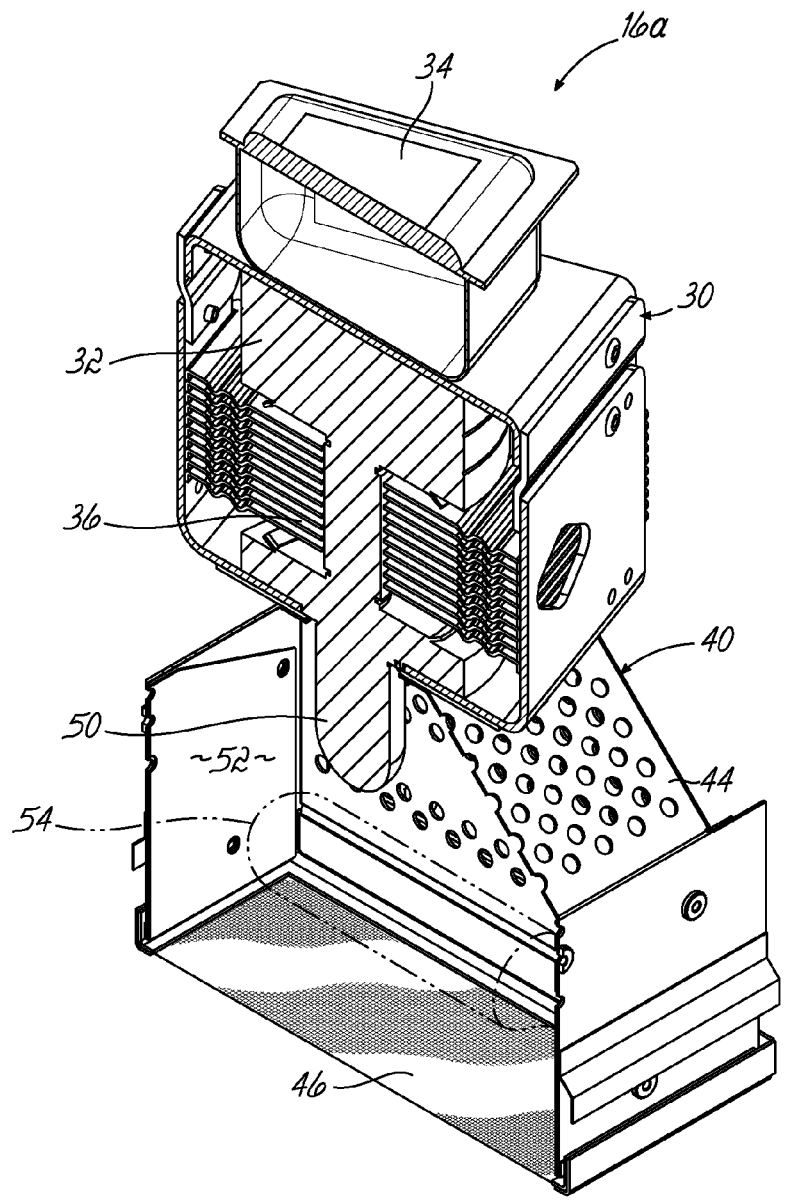
FIG. 4 is a cross sectional view taken along line 4-4 of FIG. 3, showing the interior of the microwave irradiator unit with the plasma lamp bulb shown in dash-dot lines.

Turning now to FIGS. 3 and 4, each of the microwave irradiator units 16a-i is constructed identically in this embodiment and therefore a description of irradiator unit 16a will apply to each of the other units 16b-i. Irradiator unit 16a includes a magnetron 30 with magnets 32 that provide strength to the magnetic field generated by the magnetron 30. In the embodiment shown, the cooling air entering through the duct 22 cools the magnetrons 30. In other embodiments, a water jacket (not shown) may be used instead to cool the magnetron 30. The upper end of the magnetron includes a filament filter box 34 for purposes of filtering extraneous signals from the magnetron 30. Air cooling fins 36 are mounted below the magnets 32. The magnetron 30 is mounted to an irradiator 40 using mounting fasteners 42. The irradiator 40 comprises a perforated metal plate structure 44 and a lower cover 46 in the form of a mesh screen. The perforated plate structure 44 serves to contain the RF or microwave energy generated by an antenna 50 (FIG. 4) of the magnetron 30 within an enclosed interior chamber 52 of the irradiator 30. The chamber 52 is defined by the perforated plate structure 44 and the lower cover 46. The RF or microwave energy in the chamber 52 excites the plasma in a UV lamp bulb 54 which then emits UV light generated by the excited plasma through the mesh screen 46. Whether or not a water jacket is used to cool the magnetron 30, the cooling air entering through the duct 22 is used to maintain the lamp bulb 54 at a proper operating temperature. The mesh screen 46 and the perforated plate structure 44 keep the RF energy from the magnetron antenna 50 contained within the interior chamber 52 but the mesh screen 46 allows the UV radiation or light through to the 450 mm diameter semi-conductor wafer 12.

Each magnetron inputs 3 kilowatts of power to its corresponding lamp bulb 54, and the lamp bulbs are each 6 inches long. Therefore, the lamp bulbs 54 are designed to receive 500 watts per inch of power from the associated magnetron 30. The specific array 16 of three irradiator units wide by three irradiator units deep (i.e., 16a-16i) was found to provide the optimum dosage, intensity and uniformity of UV radiation to the 450 mm diameter semi-conductor wafer 12. In addition, the use of nine single cavity irradiator units 16a-i inhibits cross talk or interference between the respective magnetrons 30 and therefore reduces the possibility of damage and increases the life of each unit 16a-i.

FIGS. 5 and 6 illustrate further details of the plenum 14. In this embodiment, a base portion 60 of the plenum 14 includes mounting lugs or brackets 62 for individually fastening the microwave irradiator units 16a-i (FIG. 2) to the plenum 14. Holes 64a-i are provided in one of the side panels 66 of the plenum 14 for receiving the previously described electrical connector fittings 18a-i (FIG. 1). Cross braces 68 are provided for securing the side panels 66 to one another.

The power control 20 (FIG. 1) may be constructed generally as disclosed in International Application No. PCT/US2011/043706, Publication No. WO2012/009353, the disclosure of which is hereby incorporated by reference herein.

While the present invention has been illustrated by a description of several embodiments, and while such embodiments have been described in considerable detail, there is no intention to restrict, or in any way limit, the scope of the appended claims to such detail. Additional advantages and modifications will readily appear to those skilled in the art. Therefore, the invention in its broadest aspects is not limited to the specific details shown and described. The various features disclosed herein may be used in any combination necessary or desired for a particular application. Consequently, departures may be made from the details described herein without departing from the spirit and scope of the claims which follow.

The invention claimed is:

1. An apparatus for generating ultraviolet light and irradiating a 450mm diameter semi-conductor wafer, the apparatus comprising:
   a plenum; and
   an array of nine RF irradiator units coupled with said plenum, each irradiator unit including a plasma lamp bulb and an RF generator operable to generate a radiation energy field to excite said plasma lamp bulb and emit the ultraviolet light, wherein said nine RF irradiator units are arranged in three rows with three of said RF irradiator units in each row to uniformly irradiate the surface area of the 450mm diameter semi-conductor wafer with the ultraviolet light.

2. The apparatus of claim 1, wherein each of said nine irradiator units further comprises a single cavity unit having a single magnetron associated with a single irradiator chamber holding said plasma lamp bulb.

3. The apparatus of claim 2, wherein said plasma lamp bulb is 6 inches long and said magnetron further comprises a 3 kilowatt magnetron.

4. The apparatus of claim 1, further comprising:
   a closed loop control coupled with said array of nine irradiator units, said closed loop control providing real time power adjustments for providing uniform distribution of radiation energy based on a selected power setting.

5. The apparatus of claim 1, wherein said RF generator further comprises a microwave generator.

6. A method for generating ultraviolet light and irradiating a 450mm diameter semi-conductor wafer, the method comprising:
- arranging the 450mm diameter semi-conductor wafer in line with an array of nine irradiator units arranged in three rows with three of the irradiator units in each row;
- generating a radiation energy field with the array of nine irradiator units;
- exciting plasma in the array of nine irradiator units with the radiation energy field;
- emitting ultraviolet light from the array of nine irradiator units toward the 450mm diameter semi-conductor wafer; and
- uniformly irradiating the surface area of the 450mm diameter semi-conductor wafer with the ultraviolet light.

7. The method of claim 6, wherein each irradiator unit further comprises a magnetron and generating the radiation energy field further comprises generating the radiation energy field with the magnetron.

\* \* \* \* \*